(12) United States Patent
Saen et al.

(10) Patent No.: US 8,116,100 B2
(45) Date of Patent: Feb. 14, 2012

(54) SEMICONDUCTOR DEVICE

(75) Inventors: Makoto Saen, Kodaira (JP); Kenichi Osada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 316 days.

(21) Appl. No.: 12/465,764

(22) Filed: May 14, 2009

(65) Prior Publication Data

US 2010/0008058 A1    Jan. 14, 2010

(30) Foreign Application Priority Data

Jul. 10, 2008    (JP) .................................. 2008-179704

(51) Int. Cl.
H05K 1/11    (2006.01)
(52) U.S. Cl. ........................................ 361/803; 257/685
(58) Field of Classification Search .................. 361/790, 361/803; 257/685, 686
See application file for complete search history.

(56) References Cited

U.S. PATENT DOCUMENTS

| 6,516,513 | B2 * | 2/2003 | Milkovich et al. | 29/830 |
| 7,317,256 | B2 * | 1/2008 | Williams et al. | 257/777 |
| 7,446,420 | B1 * | 11/2008 | Kim | 257/777 |
| 7,768,795 | B2 * | 8/2010 | Sakurai et al. | 361/790 |
| 7,786,573 | B2 * | 8/2010 | Choi et al. | 257/724 |
| 7,838,967 | B2 * | 11/2010 | Chen | 257/621 |
| 7,884,458 | B2 * | 2/2011 | Kang et al. | 257/686 |
| 2004/0257847 | A1 | 12/2004 | Matsui et al. | |

FOREIGN PATENT DOCUMENTS

JP    2004-327474 A    11/2004

* cited by examiner

*Primary Examiner* — Thanh Tam Le
(74) *Attorney, Agent, or Firm* — Miles & Stockbridge P.C.

(57) ABSTRACT

Traffic between logic LSIs and memory is increasing year by year and there is demand for increase of capacity of communication between them and reduction of power consumption in the communication. Communication distances between LSIs can be reduced by stacking the LSIs. However, in a simple stack of logic LSIs and memory LSIs, it is difficult to ensure heat dissipation to cope with increasing heat densities and ensure transmission characteristics for fast communication with the outside of the stacked package. Also required is a connection topology that improves the performance of communication among the stacked LSIs while ensuring the versatility of the LSIs. An external-communication LSI, a memory LSI, and a logic LSI are stacked in this order in a semiconductor package and are interconnected by through silicon vias. Output terminals of multiple stacked LSIs are connected to an input terminal of a through silicon via of the stacked memory LSI and input terminals of multiple stacked LSIs are connected to an output terminal of a through silicon via of the stacked memory LSI, thereby directly connecting both of the external-communication LSI and the logic LSI to a wiring line of the memory LSI.

24 Claims, 13 Drawing Sheets

SEMICONDUCTOR DEVICE

CLAIM OF PRIORITY

The present application claims priority from Japanese patent application JP 2008-179704 filed on Jul. 10, 2008, the content of which is hereby incorporated by reference into this application.

BACKGROUND OF THE INVENTION

1. Field of the Invention

The present invention relates to stacked LSIs.

2. Background Art

Performances of LSIs have been improved by integrating more and more transistors on one chip with the advance of the microfabrication technology. However, it will not necessarily be an optimum solution to increase the number of transistors integrated on one chip as before, because of the limitations of miniaturization and increase in cost of using cutting-edge processes. Therefore, three-dimensional integration in which multiple LSIs are stacked will be promising technology.

In such 3D integration, communication capability among the stacked LSIs and between the stacked LSIs and an external device is important. As communication methods for stacked LSIs, wired (a method of providing electrodes (via) in an LSI silicon board) and wireless methods are being studied.

In sophisticated media processing and network processing in these days, the transfer capacity between an LSI including a CPU and other components and a memory is increasing year by year and the performance of communication between these components is becoming the key factor that determines the overall performance. JP Patent Publication (Kokai) No. 2004-327474 makes reference to a configuration in which an LSI that provides communication between a memory and a component on a board as well as multiple memory LSIs are stacked. By stacking multiple memories provided on a plane of the system board, wiring lines to the memories can be shorten, contributing to speed enhancement and reduction in power consumption.

SUMMARY OF THE INVENTION

With regard to the background art described above, the inventors consider that stacking LSIs such as processors in conjunction with memory LSIs is effective for further improvement of performance, reduction of power consumption, and improvement of space efficiency.

The applicant has found a problem that the conventional simple stacking of logic LSIs and memory LSIs requires ensuring heat dissipation for increasing heat density and ensuring an adequate transmission path characteristic for fast communication with the outside of the stacked package. The applicant has also found that there is a need for a connection topology that improves the performance of communication between stacked LSIs while ensuring the versatility of LSIs designed to be stacked.

However, currently there are no solutions to these problems and no solutions are found in the JP Patent Publication (Kokai) No. 2004-327474 described above.

The following is a brief description of a representative aspect of the invention disclosed herein in order to solve the problems.

A semiconductor device having multiple LSIs stacked in a semiconductor package includes: a package board; a first LSI connected to the package board and including a communication circuit for performing data communication with the outside of the semiconductor package; a second LSI disposed above the first LSI and including a first storage device including multiple first memory cells provided at intersection points of multiple first bit lines and multiple first word lines; a third LSI disposed above the second LSI for performing arithmetic processing by using information stored in the first storage device; and a first through silicon via penetrating the second LSI and electrically interconnecting the first, second, and third LSIs.

According to the present invention, the performance of communication between a memory LSI and a logic LSI and between the memory LSI and an element outside the package is improved and therefore system performance can be improved.

DESCRIPTION OF SYMBOLS

PKG: Package board, LGLSI: Logic LSI, MEMLSI: Memory LSI, COMLSI: External-communication LSI, PKGB: Package board, TVPW: Power-supply through silicon via, TVSIG: Signal through silicon via, WPW: Power-supply bonding wire, WSIG: Signal bonding wire, PU: Processing block, DMA: Data transfer block, PERI: Peripheral circuit block, 3DIFA: Memory-access through silicon vias, 3DDRA: 3DIFA control block, 3DIFB: Inter-logic-LSI communication through silicon vias, 3DDRB: 3DIFB control block, 2DDR: Bonding-wire communication control circuit, OCIC: On-chip interconnect, OCBR: Inter-OCIC bridge circuit, 2DIOP: High-speed communication interface circuit, 2DIOC: 2DIOP control circuit, SCTRL: External-communication LSI controller microcomputer, MEM: Memory block, ARBMD: LSI function specification signal, ARBSIGRQ: Signal for requesting permission to use through silicon via, ARBSIGGT: Signal for granting permission to use through silicon via, WLSIG: Magnetic Signal communication circuit

DETAILED DESCRIPTION OF THE PREFERRED EMBODIMENTS

Figure 1:
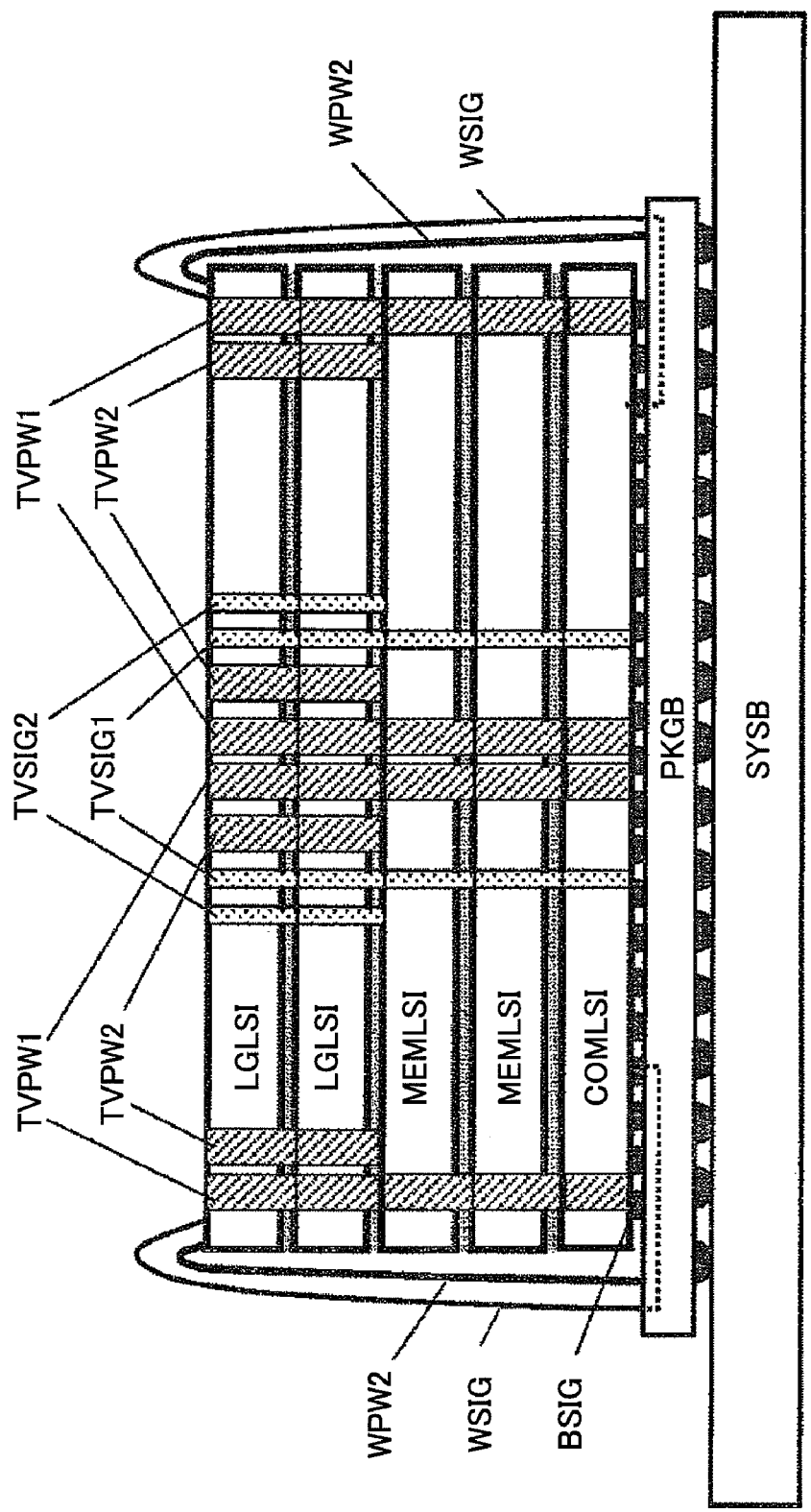
FIG. 1 is a diagram showing a configuration of a stacked-LSI package.

FIG. 1 shows one embodiment of stacked LSIs. A cross section of the stacked LSIs is shown. In the present embodiment, an external-communication LSI (COMLSI) is stacked on a package board PKGB, two memory LSIs (MEMLSIs) storing data are stacked on the external-communication LSI, and two logic LSIs (LGLSIs) including computing units are stacked on the upper memory LSI. The external-communication LSI includes a circuit that performs fast wired communication with a component on a system board that is outside the stacked-LSI package at a communication frequency exceeding 1 GHz. Fast communication with the outside of the stacked-LSI package is performed through the external-communication LSI. The external-communication LSI is flip-connected to the package board with its circuitry/wiring surface being faced to the package board. The memory LSIs may be memories such as DRAMs, SRAMs, flash memories, magnetic memories. The logic LSIs may be general-purpose processors such as CPUs, special-purpose processors such as graphics accelerators, dynamically-reconfigurable processors in which many operational circuits such as adder and multipliers are arranged and interconnected through switch circuits, or LSIs including an FPGA.

The present invention depicted in FIG. 1 is characterized in that the external-communication LSI, memory LSIs, and logic LSIs are stacked in this order in one semiconductor package and are interconnected by through silicon vias to achieve fast, large-capacity communication with shortest paths. The through silicon via herein is a hole provided in a silicon board and filled with a conductive material, through which stacked LSIs can be electrically interconnected.

The reasons why the LSIs are stacked in the order described above are described below.

First, logic LSIs consume the largest amount of electric power and are most prone to heat problems. Therefore the logic LSIs are disposed at the top of the stack to facilitate heat dissipation to the outside, thereby reducing heat problems.

Second, the external-communication LSI requires formation of a transmission path that has a few branches and joints in order to achieve fast communication. Therefore the external-communication LSI is disposed at the bottom of the stack so that the external-communication LSI can be directly connected to the package board to facilitate formation of a transmission path having a few branches and joints, thereby enabling more efficient fast communication.

For these reasons, the logic LSIs are disposed at the top, the external-communication LSI is disposed at the bottom and the memory LSIs are disposed between them. This arrangement enables fast communication with a component outside the stacked-LSI package while ensuring reliably against the heat problem.

For the same reasons, the logic LSIs performing computation are isolated from the external-communication LSI in the present embodiment. If the logic LSIs and the external-communication LSI were mounted on the same chip and were stacked together with the memory LSIs, one of fast communication and reliability against heat would be sacrificed. In some cases where more logic LSIs are stacked, the tendency becomes more noticeable.

In FIG. 1, the stacked LSIs are interconnected by through silicon vias, formed by filling vias vertically provided in the silicon board with a conductive material to form wiring lines, and bonding wires WPW2. TVPW1 and TVPW2 are through silicon vias for supplying electric power. TVPW1 are through silicon vias for supplying common electric power to the memory LSIs and logic LSIs. The power is coupled to power lines of the memory LSIs and the logic LSIs through the package board, the external-communication LSI, and TVPW1. The through silicon vias TVPW2 supply power required only by the logic LSIs and the power is coupled from an external source outside the package to power lines of the logic LSIs and TVPW2 through the package board and bonding wires WPW2.

In FIG. 1, two types of through silicon vias are provided: through silicon via TVPW1 that passes through all of the logic LSIs, memory LSIs, and external-communication LSI and through silicon via TVPW2 that passes through only the logic LSIs. TVPW2 are provided in the logic LSIs besides TVPW1 in order to supply different power-supply voltages to the logic LSIs. In particular, depending on the configuration of logic circuits, the logic LSIs may require a high voltage of the order of approximately 3.3 V whereas the memory LSIs may not. If there is a high-voltage power-supply required only by the logic LSIs, it is desirable to provide a separate path to directly supply the high-voltage power to the logic LSIs because an unnecessary load is not placed on TVPW1 and other circuits and malfunctions of the circuits can be prevented.

A feature of the present invention is that the voltage required only by the logic LSIs is supplied to the logic LSIs through the bonding wires WPW2. This feature is advantageous in terms of the area of the external-communication LSI and memory LSIs because power required only by the logic LSIs can be supplied to the logic LSIs without having to providing holes for forming through silicon vias in the external-communication LSI and the memory LSIs.

Alternatively, instead of providing through silicon vias TVPW2 that pass through only the logic LSIs as shown in FIG. 1, through silicon vias TVPW2 that passes all of the LSIs, like TVPW1, can be provided. In that case, TVPW2 supplying power required only by the logic LSIs are not connected to the wiring lines of the external-communication LSI and the memory LSIs. The external-communication LSI and the memory LSIs provide only signal lines to TVPW2. Although disadvantageous in terms of the area of the external-communication LSI and memory LSIs, this implementation is advantageous in the cases where bonding wires cannot be used as in LSIs in intermediate layers and where an increased level of power-supply is desired.

Communication paths between the LSIs and communication paths to the outside of the package in the present embodiment will now be described. Communication between the logic LSIs is performed by through silicon vias TVSIG2. Communication between the logic LSIs and memory LSIs are performed by through silicon vias TVSIG1. Communication between the logic LSIs and the external-communication LSI is carried out by through silicon vias TVSIG2, bonding wires WSIG, and wiring lines inside the package board PKGB. Communication between the logic LSIs and an external component outside the package is carried out by through silicon vias TVSIG2, bonding wires WSIG, wiring lines in the package board PKGB, and wiring lines in the system board SYSB. Communication between the external-communication LSI and the memory LSIs is performed by through silicon vias TVSIG1. Communication between the external-communication LSI and the outside of the package is performed through wiring lines in the package board PKGB and wiring lines in the system board SYSB. Communication between the memory LSIs and a component outside the package is carried out by through silicon vias TVSIG1, the external-communication LSI, wiring lines inside the package board PKGB, and wiring lines inside the system board SYSB. The term communication as used herein refers to input and output of all kinds of information except power-supply, including signals such as reset signals, endian signals, initial value signals for setting the operating frequency and terminal settings, LSI identification signals.

Provided as communication paths are through silicon vias TVSIG1 passing through the logic LSIs, the memory LSIs, and the external-communication LSI and through silicon vias TVSIG2 interconnecting the logic LSIs. In addition, the logic LSIs are connected to the package board through bonding wires WSIG for data communication.

As has been described, in the LSI package in FIG. 1, both the external-communication LSI and the logic LSIs are directly connected to the memory LSIs by the through silicon vias TVSIG1 for communication. This configuration can maximize the performance of memory-access from the logic LSIs and the external-communication LSI.

Typical operation of the system is as follows. The external communication LSI reads data such as an image or communication packets to be processed from an external source into a memory LSI and a logic LSI performs some arithmetic operation on the data. The logic LSI stores the result in the memory LSI and the external-communication LSI outputs the result from the memory LSI to an external storage or network. In the operation in which the external-communication LSI receives data and stores the data in the memory LSI and the logic LSI performs computation on the data or in the operation in which the logic LSI stores the data it computed in the memory LSI and the external-communication LSI outputs the data to the external storage or network as described above, the external-communication LSI and the logic LSI can share a memory in the memory LSI because the external-communication LSI, the memory LSI, and the logic LSI are stacked in this order in the stacked-LSI package of the present embodiment. In addition, because the LSIs are arranged in order corresponding to the order in which data is transmitted and received, communication between the external-communication LSI and the memory LSI and between the logic LSI and the memory LSI can be efficiently performed.

In the stacked-LSI package in FIG. 1, through silicon vias TVSIG2 are provided in addition to through silicon vias TVSIG1 that interconnect all LSIs. However, communication between the logic LSIs performed through TVSIG2 in FIG. 1 can also be performed through common TVSIG1. Such arrangement can reduce the number of through silicon vias of the logic LSIs and therefore is advantageous in terms of the area of the logic LSIs.

On the other hand, the provision of TVSIG2 interconnecting only the logic LSIs enables fast communication required of the logic LSIs. Similarly, a dedicated through silicon via can be provided between the external-communication LSI and a memory LSI to provide a path used by the external-communication LSI for fast accessing the memory LSI.

While TVSIG2 connecting some of the stacked LSIs are illustrated as interconnecting only the logic LSIs in the present embodiment, the present invention is not so limited. TVSIG2 may be through silicon vias that interconnect some of the LSIs. Therefore, through silicon vias that interconnect some of other types of stacked LSIs (for example a logic LSI and a memory LSI) may be used. The through silicon via that passes any of those LSIs enables fast communication between the LSIs that are interconnected.

Bonding wires are used in conjunction with the through silicon vias for interconnecting LSIs in order to meet requirements of both of the general versatility and communication performance of the stacked LSIs. In the exemplary embodiment in FIG. 1, the memory LSIs are general-purpose stacked LSIs intended to be stacked with a wide range of other LSIs. Because of the versatility of the LSIs, it is not realistic to form all of the lines of signals that are specific to logic LSIs stacked at the top as through silicon vias in memory LSIs. Here, the signals specific to logic LSIs are those signals required by the logic LSIs but not held by the memory LSIs, such as signals for communication between the logic LSIs and the external-communication LSI, logic LSI identification signals, and initial value signals for operating frequencies of the logic LSIs. Consider the typical operation in the example in FIG. 1 in which the external communication LSI reads data such as an image or communication packets to be processed from an external source into one of the stacked memory LSIs, a logic LSI performs some arithmetic processing on the data, the logic LSI stores the result in the memory LSI, and the external-communication LSI outputs the result from the memory LSI to an external storage or network. A signal for communication between the logic LSIs and the external-communication LSI, an identification signal for identifying the logic LSI, and initial value signals of the operation frequency of the logic LSI are not required by the memory LSI and therefore do not need to be passed through the memory LSI. Also, these signals need neither large-capacity nor high-speed communication. Therefore, bonding wires are used for these signals in the present embodiment, thereby eliminating the need for providing through silicon vias that are not required by the memory LSIs in the memory LSIs. In addition, the use of bonding wires enables through silicon vias to be allocated to other data communication that requires large-capacity, fast communication.

While the stacked LSIs are directly interconnected in the embodiment in FIG. 1, an interposer layer which has wired lines for adjusting terminal positions may be inserted between a memory LSI and a logic LSI and between a memory LSI and the external-communication LSI. An interposer layer may be required for example if a through silicon via in a memory LSI is not aligned with a through silicon via in a logic LSI. A rewiring layer can be used for the same purpose.

LSIs may be provided in a face-down manner (in which the surface on which circuitry is disposed faces downward) or in a face-up manner (in which the surface on which circuitry is provided faces upward). However, face-down is preferable in special situations as described below. The reasons will be detailed below.

First, disposing the external-communication LSI face down enables the communication circuit to be directly connected to the package board and therefore enables faster communication.

It may be preferable to dispose the logic LSI at the top among the logic LSIs face down if the logic LSI does not need to be wire-bonded. This is because the logic LSI at the top can be connected to a through silicon via without having to providing a hole in the top logic LSI. This is advantageous in terms of process cost and circuit area.

Figure 2:
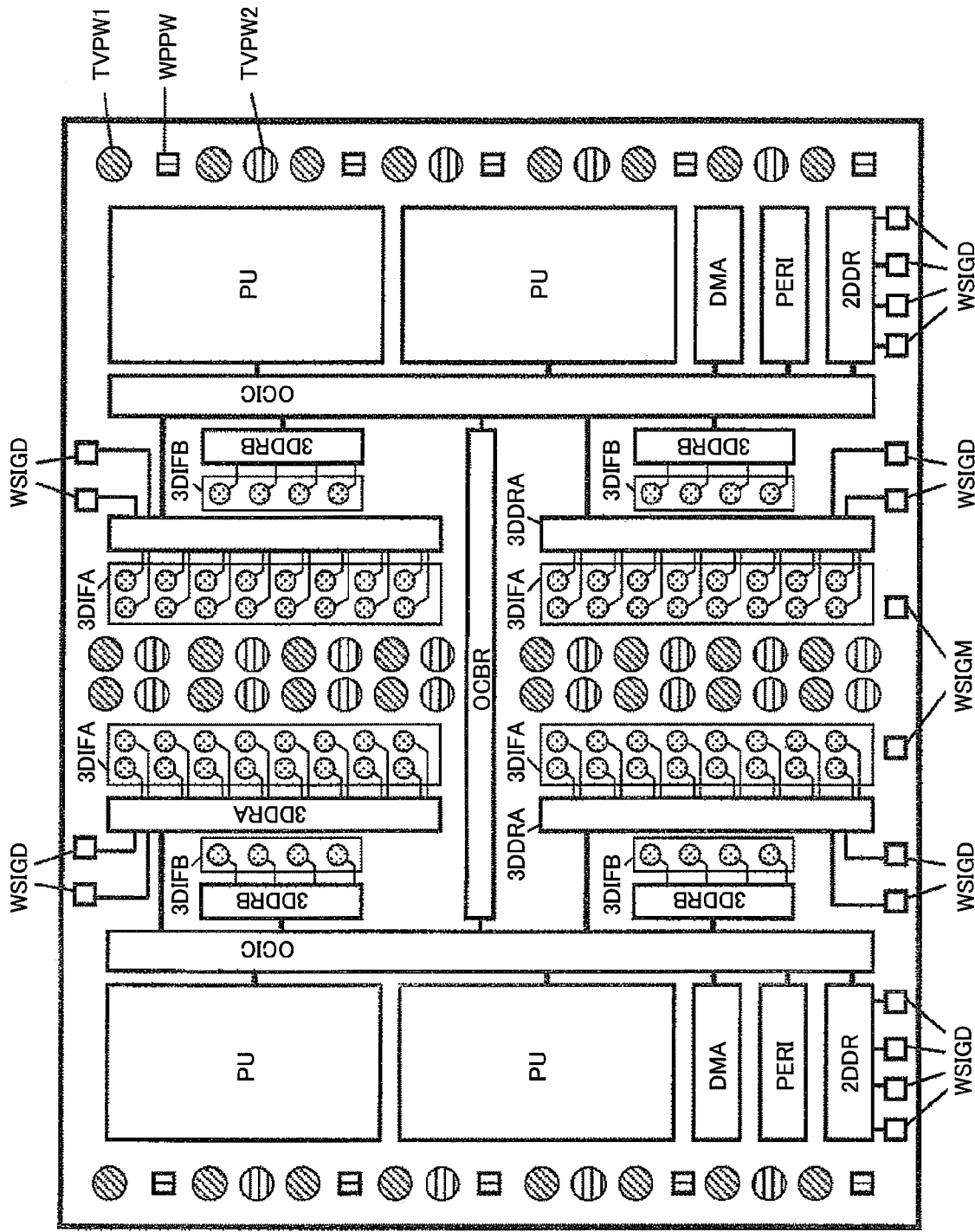
FIG. 2 is a diagram showing a configuration of a stacked logic LSI.

FIG. 2 shows one embodiment of a logic LSI. The logic LSI includes processing blocks PU for performing arithmetic operations, data transfer blocks DMA, peripheral circuit block PERI including a interrupt control, clock control, and timer and the like, through silicon via signals 3DIFA for communication with memory LSIs, and a control block 3DDRA for controlling communication performed by the LSI using 3DIRA. 3DIFA and 3DDRA together form input/output ports through which communication is performed with another LSI. Through silicon via signals 3DIFB are used for communication with another logic LSI. Control blocks 3DDRB are used for communication using 3DIFB. 2DDR are control blocks used for communication with the external-communication LSI through a bonding wire and for low-speed communication with the outside of the stacked-LSI package. On-chip interconnects OCIC interconnect on-chip blocks. A bridge circuit OCBR interconnects OCIC. Through silicon vias TVPW1 and TVPW2 are through silicon vias shown in FIG. 1 for supplying power. Electrodes WPPW are used for supplying power through bonding wires (WPW2 in FIG. 1), and electrodes WSIGD and WSIGM are used for coupling signals through bonding wires (WSIG in FIG. 1). WSIGD is a signal dynamically used for read/write and synchronization between LSIs, for example. WSIGM is a signal statically used for LSI identifiers and initial value settings. Power supplied from WPPW as power-supply for the logic LSI is further coupled to TVPW2 and is provided to a lower logic LSI. WSIGD in FIG. 1 is connected to WSIGD and WSIGM. WSIGD is a signal dynamically used for data read/write, synchronization between LSIs, and software debugging for the logic LSI (such as JTAG and internal state observation signals). WSIGM is a signal statically used for such as endian signals, LSI identification signals and signals for specifying a function of the LSI.

Through silicon via signals 3DIFA are formed by TVSIG1 and TVSIG2 in FIG. 1 and are used for communication with a logic LSI, a memory LSI, and the external communication LSI. When a data read/write from PU or DMAC to a memory area in a memory LSI occurs, the request is provided to 3DDRA through the on-chip interconnect OCIC and the 3DDRA outputs a data read/write request to the memory LSI through 3DIFA on the basis of the request. 3DDRA receives reply data from the memory LSI for the access through 3DIFA and outputs the information to PU or DMAC that has issued the request to the memory LSI, through OCIC. The through silicon via signals 3DIFB are formed by TVSIG2 in FIG. 1 and are used for communication between logic LSIs. The through silicon via signals 3DIFB include a read/write request signal from PU or DMAC of a logic LSI to another logic LSI, a reply signal to the read/write request, an interrupt-related signal between logic LSIs, a signal for memory coherence between logic LSIs, a signal for timing synchronization between logic LSIs, and a signal for supporting logic LSI software debugging.

By disposing interfaces in the same location in LSIs, communication only in the vertical direction in the stack is enabled. This eliminates the need for communication in the plane of each LSI and therefore is advantageous in fast communication as compared with communicating between the LSIs in the horizontal or an oblique direction.

Figure 3:
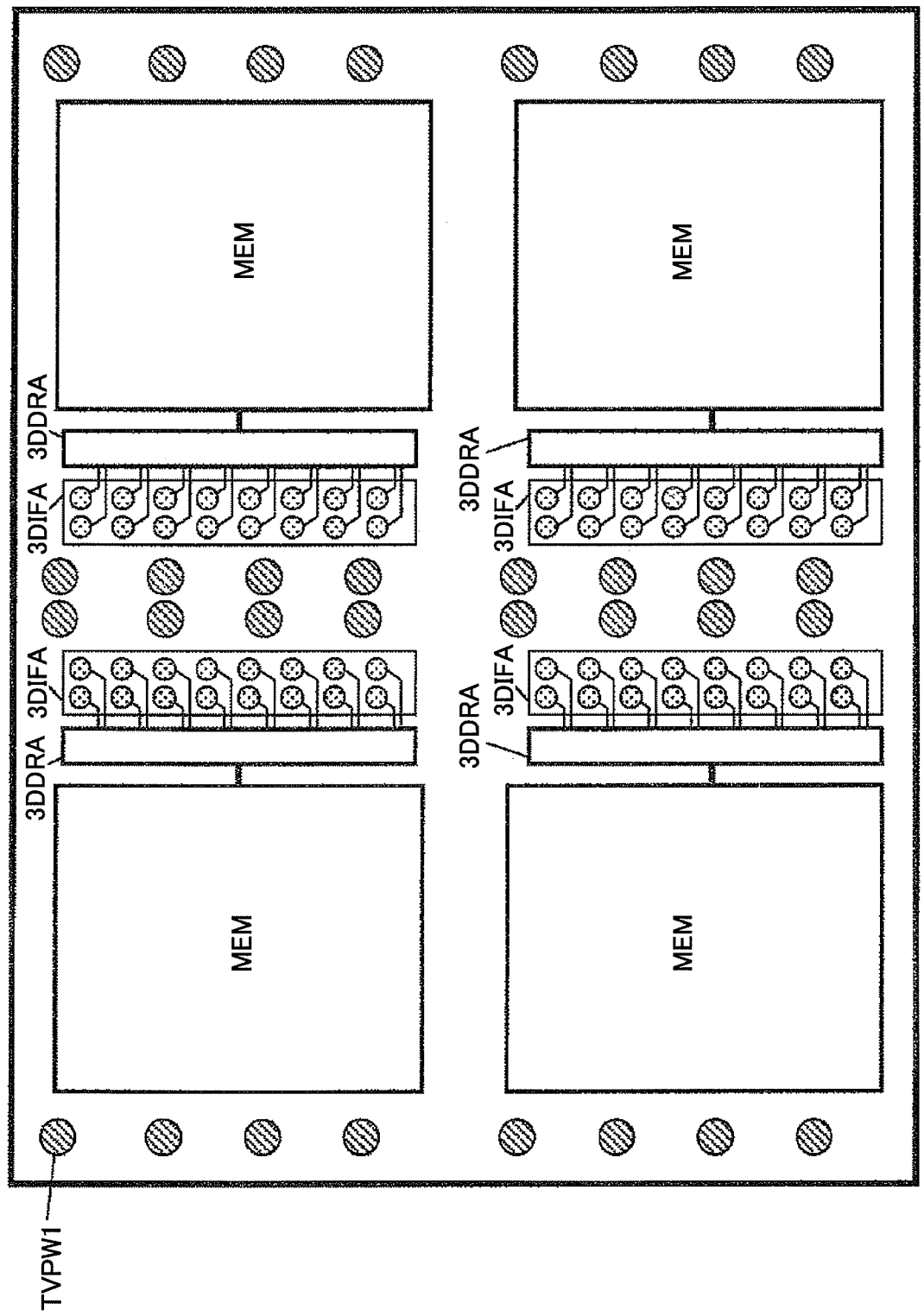
FIG. 3 is a diagram showing a configuration of a stacked memory LSI.

FIG. 3 shows one embodiment of a memory LSI. The memory LSI includes memory sections MEM including a memory array, through silicon via signals 3DIFA for communicating with a logic LSI and the external-communication LSI, a control block 3DDRA for communication using 3DIFA, and silicon-thorough-hole electrodes TVPW1, shown in FIG. 1, for supplying power.

The memory LSI receives a read/write request output from a logic LSI and the external communication LSI through 3DIFA, performs read/write processing to a memory section MEM according to the request, and outputs reply information including read data to 3DIFA if the request is a read request. The read/write request includes information for synchronization between LSIs, LSI selection information for selecting one of the multiple stacked memory LSIs, command information indicating a read/write, address information, a process identifier and, in the case of a write, data to be written. The reply information includes information for synchronization between LSIs, read data, and a process identifier. The process identifier is information included in the read/write request to the memory LSI. The memory LSI places the process identifier in the reply information. The logic LSI or external communication LSI that issued the read/write request refers to the process identifier to select reply information corresponding to the request it issued. When many stacked LSIs issue requests to the memory LSI at a time, the requests from the other LSIs are also output onto a through silicon via. Therefore the process identifier is required. Here, the process identifier is data indicating the destination and sender of the data requested to be read or written. The process identifier added enables an LSI to be identified among stacked LSIs of the same type. Accordingly, LSIs of the same time can be stacked together and scalability can be increased. An arbitration request signal, which will be described later, is also added to the request signal.

By issuing requests including a process identifier, a common through silicon via can be shared by multiple LSIs.

Figure 4:
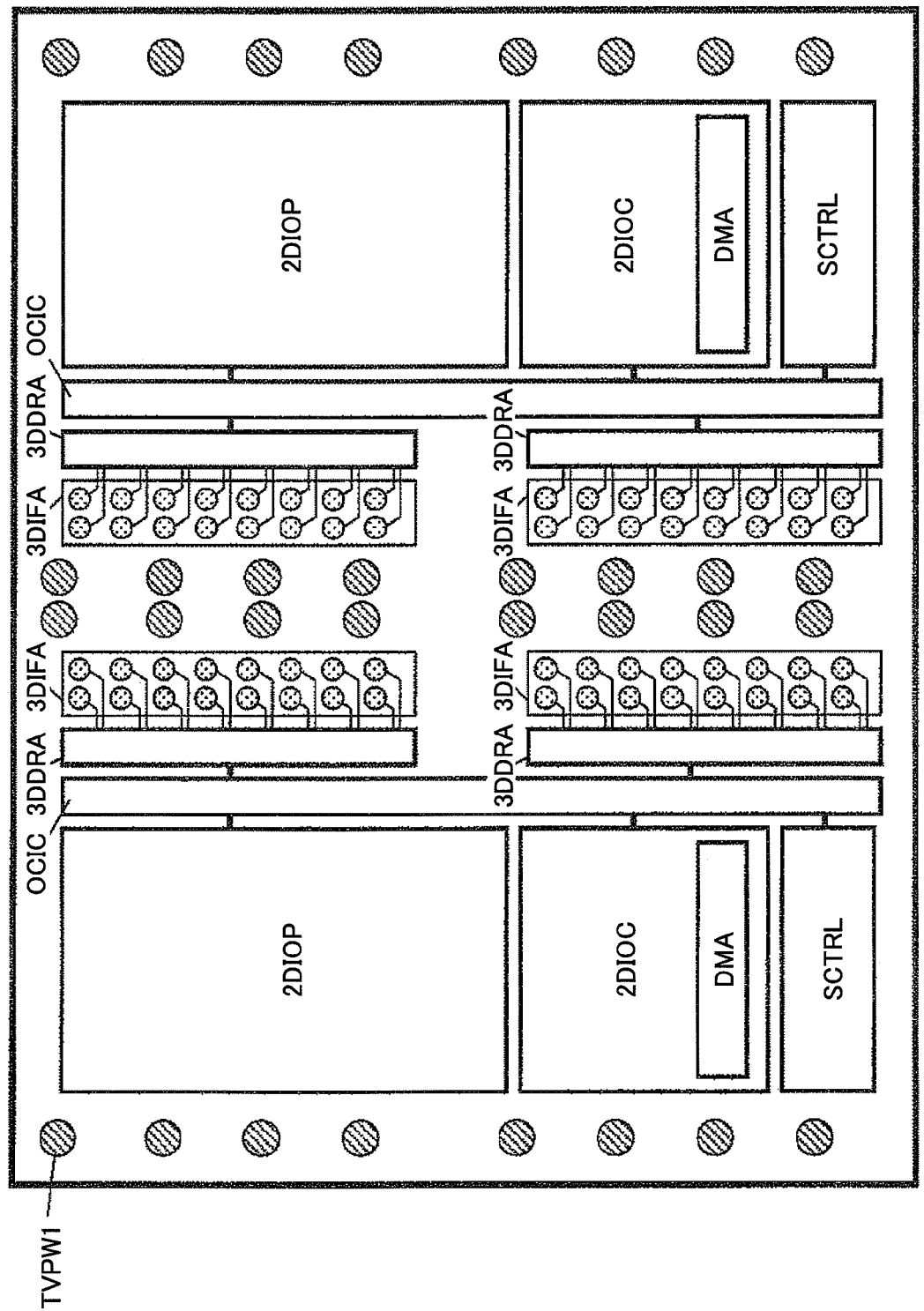
FIG. 4 is a diagram showing a configuration of a stacked external-communication LSI.

FIG. 4 shows one embodiment of the external communication LSI. Interface circuit blocks 2DIOP perform fast communication with a component outside the 3D stacked package. Blocks 2DIOC are used for controlling 2DIOP, small controller microcomputers SCTRL are used for controlling 2DIOC, through silicon via signals 3DIFA are used for communication with memory LSIs. Control blocks 3DDRA are used for communication using 3DIFA. On-chip interconnects OCIC interconnects on-chip blocks. Through silicon vias TVPW1 are power-supply through silicon vias shown in FIG. 1. 2DIOC includes a data transfer block DMA transferring data between address spaces specified in embedded registers. The controller microcomputers SCTRL execute processes relating to communication with another stacked LSI or an element outside the package, such as a program performing communication with a logic LSI and a program setting registers of 2DIOC.

Figure 5:
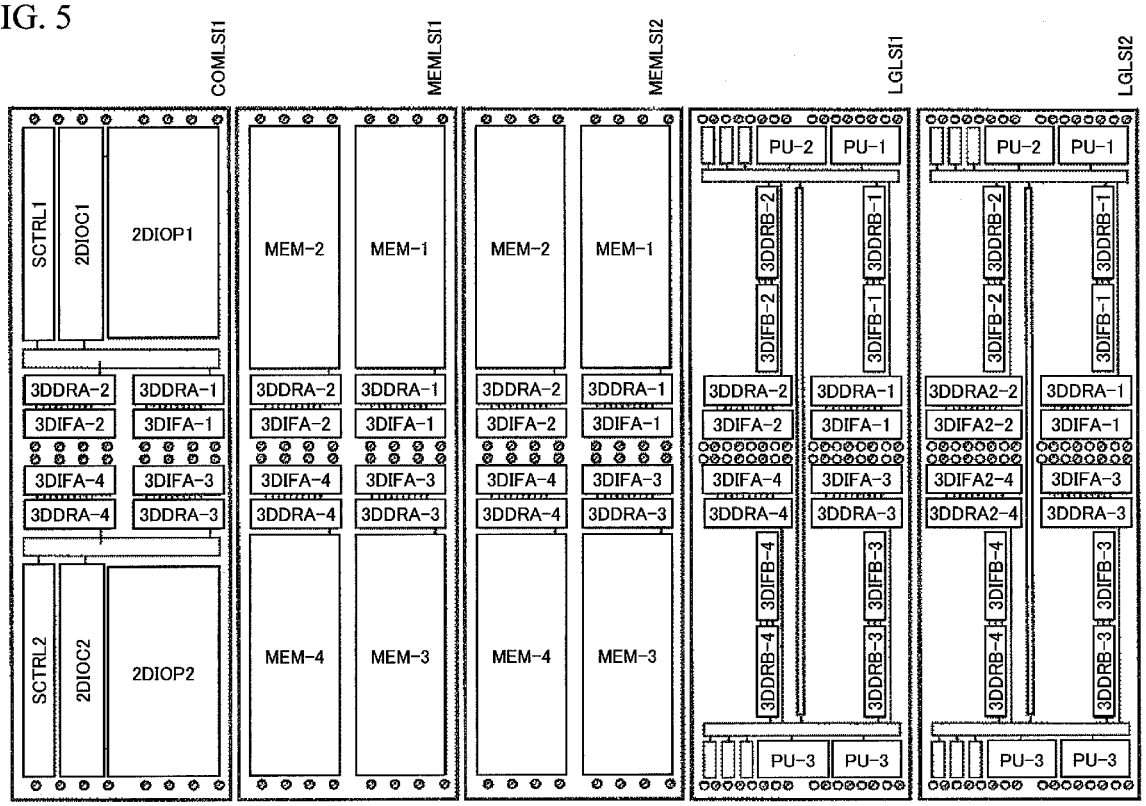
FIG. 5 is a diagram showing the positional relationship among LSIs in a stacked-LSI package.

FIG. 5 shows the positional relationship among stacked LSIs and an access method using through silicon vias. As has been described above, the through silicon via signals 3DIFA (3DIFA-1, 3DIFA-2, 3DIFA-3, and 3DIFA-4 in FIG. 5) are used for performing read/write on memory LSIs (MEMLSI1 and MEMLSI2). Each memory LSI has four input/output ports. Through silicon via signals 3DIFA are connected to each of the four ports. Logic LSIs and an external-communication LSI are connected to the through silicon vias and use common 3DIFA in a time-sharing manner to access the memory LSI. Since each 3DIFA is shared by multiple LSIs, the LSIs cannot access the memory at the same time. Therefore, an arbitration function is provided for each 3DIFA that arbitrates requests for permission to use 3DIFA from logic LSI1, LSI2, and the external-communication LSI and grants one of the logic LIS1, LS12, and external-communication LSI the permission to use the 3DIFA. In the embodiment in FIG. 5, 3DDRA-1 of LGLSI1 has the arbitration function for 3DIFA-1, 3DDRA-2 of LGLSI2 has the arbitration function for 3DIFA-2, 3DDRA-3 of LGLSI1 has the arbitration function for 3DIFA-3, and 3DDRA-4 of LGLSI2 has the arbitration function for 3DIFA-4. The arbitration function is provided at the LSI that needs to most frequently access a memory section to which each 3DIFA is connected.

The arbitration function according to the present embodiment is characterized in that the arbitration is provided for the LSI that most frequently accesses a memory section. This characteristic enables access to the memory section that occurs most frequently to be made by default. Therefore, the throughput can be improved as compared with a case where an arbitration function is provided for another LSI and an arbitration request is frequently issued to that LSI. A method for providing the arbitration function for a particular LSI will be described later with respect to FIG. 6.

In the example in FIG. 5, PU1 and PU2 of LGLSI1 most frequently use MEM1 of MEMLSI1 and MEMLSI2. Accordingly, 3DDRA-1 in the same LSI in which PU1 and PU2 are contained is responsible for arbitrating requests for 3DIFA-1. When logic LSI1, LSI2, and the external-communication LSI want to access the memory LSI by through silicon via 3DIFA-1, they first issue a request for permission to use 3DIFA-1 to 3DDRA-1 of LGLSI1 that has the arbitration function for 3DIFA-1, and then the LSI granted permission by 3DIFA-1 uses 3DIFA-1 to output a read/write request to the memory by using 3DIFA-1.

The primary reasons for providing interconnection between a logic LSI and a memory LSI and between the external communication LSI and the memory LSI as described above are: (1) the same connection method can be used to meet a change of the number of stacked layers, thereby achieving high scalability with respect to the number of stacked layers, and (2) direct interconnections can be made between a logic LSI and a memory LSI and between the external communication LSI and a memory LSI where traffic volumes are high, thereby improving the communication efficiency.

On the other hand, through silicon vias 3DIFB (3DIFB-1, 3DIFB-2, 3DIFB-3, and 3DIFB-4 in FIG. 5) are signals for communication between logic LSIs (LGLSI1 and LGLSI2). The through silicon via is used to access an on-chip memory or a function circuit in another logic LSI or a memory block in a memory LSI that is not directly connected by 3DIFA. For example, when PU1 in LGLSI1 wants to make read/write access to a memory area in PU1 of LGLSI2, PU1 in LGLSI1 generates a read/write request to OCIC connected. The request includes target address information indicating the memory area to access in PU1 of LGLSI2, requester address information to which a reply is to be returned, and a command. When OCIS receives the request, OCIC decodes the target address information and generates at 3DDRB-1 in LGLSI1 a read/write request to LGLSI2. Then 3DDRB-1 outputs the request to 3DIFB-1. 3DDRB-1 in LGLSI2 receives the request through 3DIFB-1 in LGLSI2 and outputs the request to OCIC in LGLSI2, which in turn sends the request to PU1 in LGLSI2 based on the target address. After processing the request, PU1 in LGLSI2 returns a reply together with the requester address. The returned information is sent back to PU1 in LGLSI1 based on the requester address.

Figure 6:
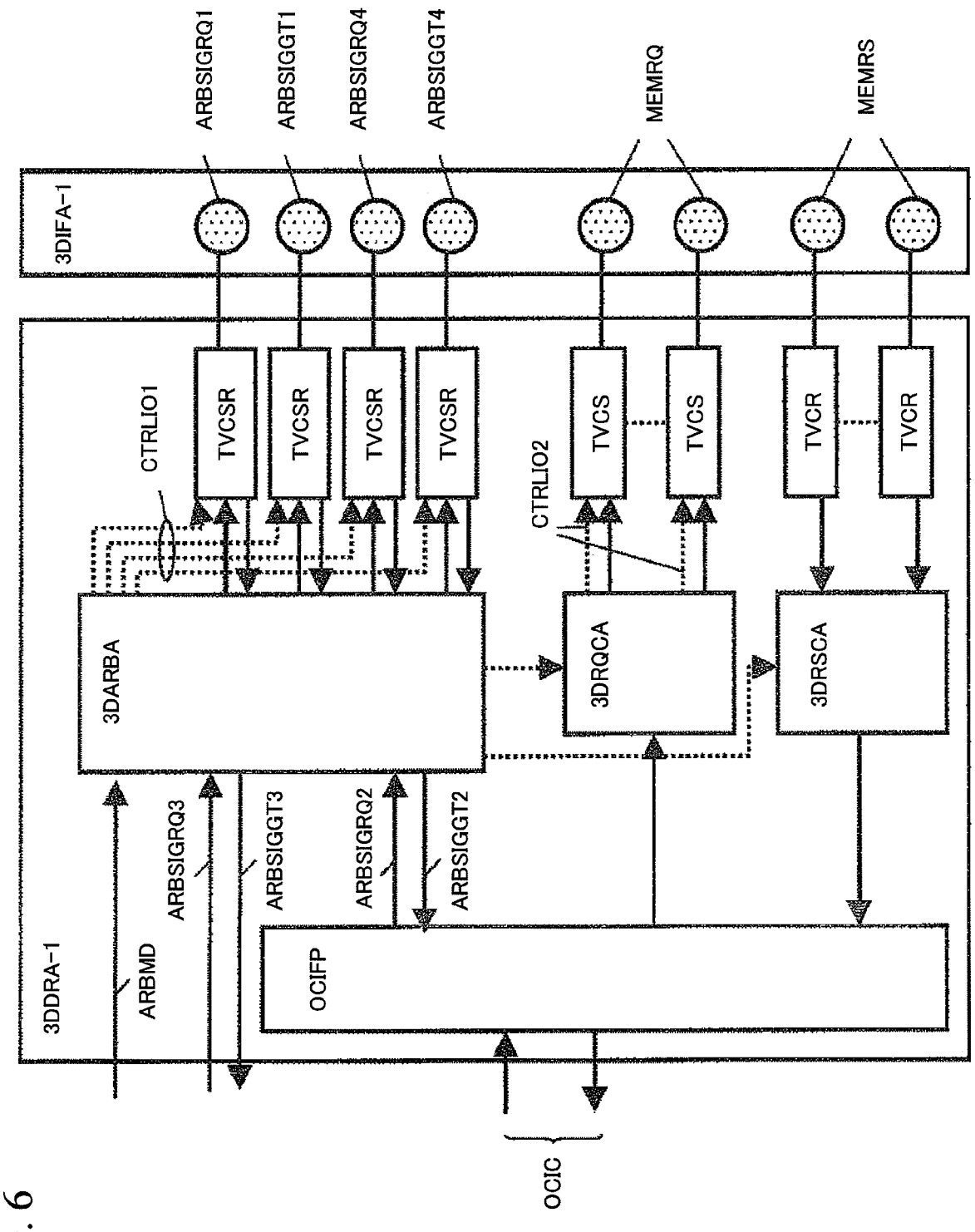
FIG. 6 is a diagram showing a through silicon via control section in a logic LSI.

FIG. 6 shows 3DDRA-1 and 3DIFA-1 in LGLSI1 in FIG. 5. 3DDRA-1 arbitrates requests for permission to use 3DIFA-1 connected. Since multiple LSIs fabricated using the same mask are stacked, as with the logic LSIs shown in FIGS. 1 and 5, it is required to specify whether each 3DDRA performs arbitration or not. This is specified by using a specification signal ARBMD indicating 3DDRA-1 which has the arbitration function. The ARBMD signal may be a 1-bit or multi-bit signal.

One method for assigning a value to the signal ARBMD is to use a fuse circuit. In the fuse method, a load is applied to a fuse by electricity or laser to open the fuse in fabrication of the stack to assign a desired value to ARBMD. In another method for assigning a value to ARBMD, a nonvolatile memory device is integrated in the LSI, the output of the nonvolatile memory device is coupled to ARMBD, and a value for ARMBD is written in the nonvolatile storage device during fabrication of the stack. In yet another method for assigning a value to ARBMD, the ARBMD signal line is lead out as an external terminal of the LSI and a 0/1 signal is coupled to the external terminal during fabrication of the stack. In yet another method for assigning a value to ARBMD, the ARBMD signal is coupled to the output of a memory element writable from a processor PU, and the ARBMD value is written in the memory element by the PU after activation of the PU.

It is also possible to specially configuring a particular LSI to have an arbitration function, instead of specially providing ARBMD. However, a special mask needs to be used to fabricate the special LSI having the arbitration function, which adds to production costs.

In contrast, the configuration of the present embodiment in which ARBMD is used to provides the arbitration function to 3DDRA eliminates the need for an LSI specially configured to include the arbitration function to reduce the cost of manufacturing a mask and therefore can reduce production costs. The configuration of the present embodiment also has the above-described effect of improving throughput and scalability by allocating the arbitration function to a particular LSI that frequently accesses a memory LSI.

For example, LGLSI1 and LGLSI2 in FIG. 5 may be implemented by exactly identical LSIs. 3DARBA in 3DDRA-1 is responsible for performing arbitration. 3DARBA receives a request signal (ARBSIGRQ1) for permission to use 3DIFA-1 from another logic LSI (LGLSI2), a request signal (ARBSIGRQ2) for permission to use 3DIFA-1 from a circuit block such as PU or DMA in LGLSI1, and a request signal (ARBSIGRQ3) for permission to use 3DIFA-1 from the external-communication LSI (COMLSI), and arbitrates the requests for permission to use 3DIFA-1. The request signal ARBSIGRQ1 is output from LGLSI2 in FIG. 5 and is transferred to 3DARBA by a through silicon via (TVSIG2 in FIG. 1). The request signal ARBSIGRQ2 is output from a circuit block in LGLSI1 and is transferred to 3DARBA through an internal on-chip interface (OCIC in FIG. 1). ARBSIGRQ3 is output from the external-communication LSI and is transferred to 3DARBA through a bonding wire (WSIG in FIG. 1) and a wiring line in LGLSI1. As a result of the arbitration, 3DARBA asserts a permission signal to a circuit to grant permission. ARBSIGGT1 is a signal for granting permission to use 3DIFA-1 to another logic LSI (LGLSI2); ARBSIGGT2 is a signal for granting permission to use 3DIFA-1 to a circuit block such as PU and DMA in LGLSI1; and ARBSIGGT3 is a signal for granting permission to use 3DIFA-1 to the external-communication LSI (COMLSI). ARBSIGGT1 is transferred to LGLSI2 by a through silicon via (TVSIG2 in FIG. 1). ARBSIGGT2 is transferred through an internal on-chip interface (OCIC in FIG. 1) to the circuit block that requested permission. ARBSIGGT3 can be output to the external-communication LSI through a wiring line in LGLSI1 and a bonding wire WSIG or by a through silicon via. ARBSIGRQ4 and ARBSIGGT4 have the same functions as ARBSIGRQ1 and ARBSIGGT1, respectively, and are spare signals reserved for layers added in the future. It is not preferable to share the signal for requesting permission to use 3DIFA because overhead would increase. On the other hand, provision of spare signals as in the present embodiment does not significantly add to circuit area and is advantageous when an additional stack layer is added.

MEMRQ is a through silicon via for requesting memory-access. 3DDRA of an LSI granted permission to use 3DIFA-1 outputs a memory-access request to MEMRQ. MEMRQ is used to send information such as information used for synchronization between LSIs, LSI selection information for selecting one of the multiple stacked memory LSIs, command information indicating a read/write, address information, a process identifier, and data to be written to the memory.

MEMRS is a through silicon via for the memory to return a reply such as read data. 3DDRA that issued a request receives read data, a process identifier, and a timing synchronization signal from the memory.

OCIFP in FIG. 6 is an interface circuit for connecting to an on-chip interconnect OCIC. 3DRQCA is a circuit which converts a read/write request provided from OCIC to a format for outputting to MEMRQ and outputs the request at a timing indicated by 3DARBA. 3DRSCA is a circuit that selects required data among data obtained through MEMRS, converts the data into an appropriate format, and outputs the converted data to OCIFP.

TVCSR, TVCS, and TVCR are circuit blocks that transmit a signal to a through silicon via or receives a signal from a through silicon via. TVCSR is a bidirectional circuit block for both transmission and reception and is used for transferring requests and grant signals for permission to use 3DIFA-1.

Each of the stacked or logic LSIs has a signal identifying the LSI among LSIs having the same configuration such as logic LSIs. For example, PU contained in a logic LSI can use information from the signal to know what number in order the logic LSI is. The information can be used from a program running on each PU to alter operation of the PU. The identification signal value is assigned to each LSI by using a method similar to that for ARBMD after fabrication.

Figure 7:
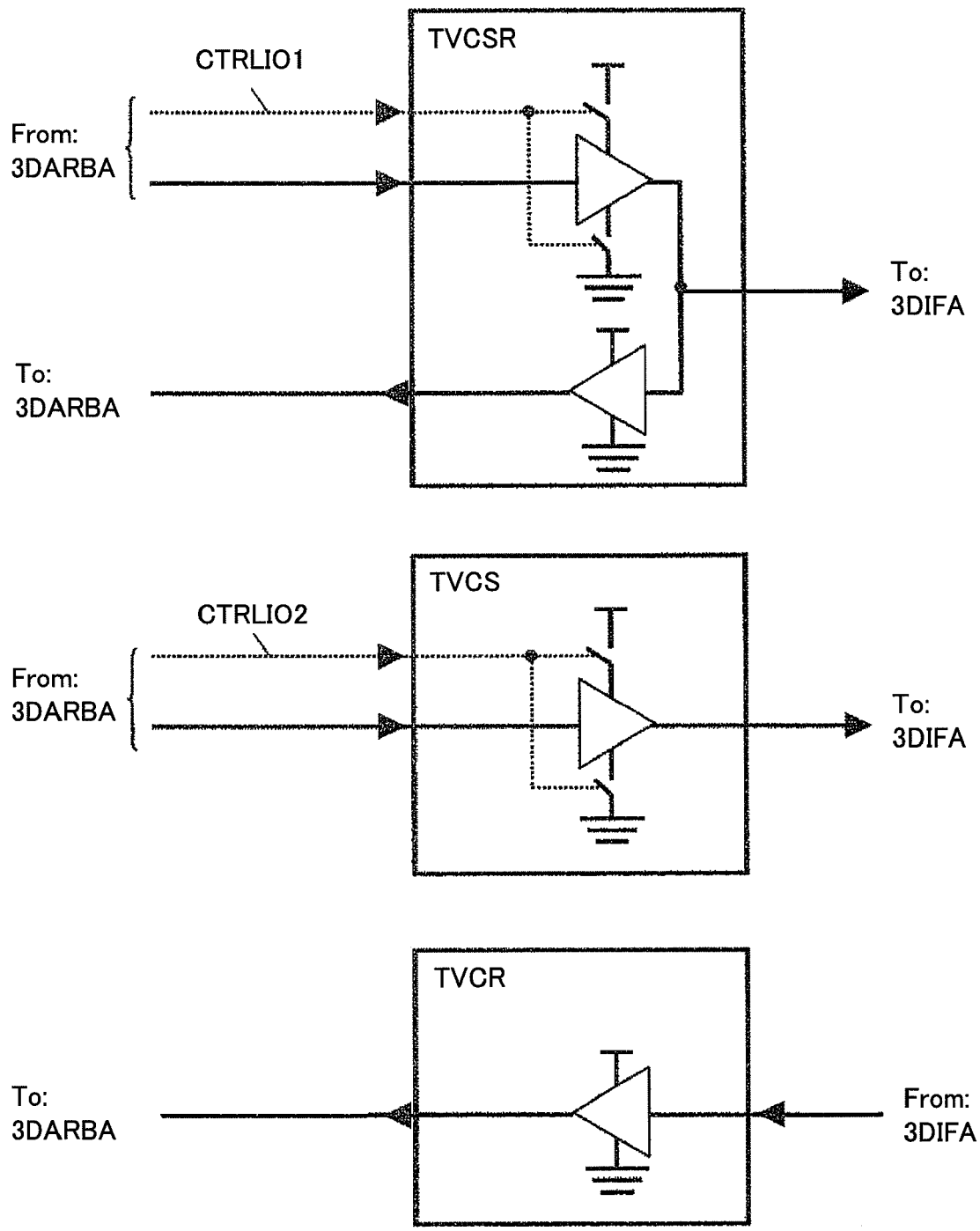
FIG. 7 is a diagram showing circuits in a through silicon via control section.

FIG. 7 shows circuit configurations of the circuit blocks TVCSR, TVCS, and TVCR. TVCS is a circuit block for outputting a signal to a through silicon via. The circuit includes an output terminal to the through silicon via, an input terminal for data to be output, and a control input terminal for specifying whether the circuit block should output a signal or should be placed in a floating state (or output a weak signal) independently of an input signal. Here, inputs to the data input terminal and the control input terminal are output from 3DARBA shown in FIG. 6. CTRLIO2 is coupled to the control input terminal. CTRLIO2 is asserted only when permission to use 3DIFA is granted and remains asserted only in a period during which data is output. In the assert period, the circuit block TVCS remains active and data is output from TVCS to 3DIFA. In the other period, TVCS is in the floating state, is inactive, and maintains the output to 3DIFA in a high-impedance state independently of the value of input, thereby freeing 3DIFA for other circuits. This configuration can eliminate the influence of an LSI on another LSI when the LSI is to perform communication. Therefore, multiple LSIs can perform data communication through the same through-hole-electrode. The configuration and effect are the same for TVCSR described below.

TVCR is a circuit for receiving data from a through silicon via.

TVCSR is a circuit used for a request for permission to use 3DIFA-1 and a permission grant signal in the embodiment in FIG. 6. TVCSR has a circuit configuration in which a signal can be input from a through silicon via and in which a signal can be output to the through silicon via. Switching between input and output is made depending on whether 3DDRA connected is responsible for arbitrating requests to permission to use 3DIFA. In the example, a case will be described in which 3DDRA performs arbitration. Here, TVCSR receives requests for permission to use 3DIFA-1 sent from other stacked LSIs through ARBSIGRQ1 and ARBSIGRQ4 and sends a grant for use of 3DIFA to the LSIs through ARBSIGGT1 and ARBSIGGT4. To that end, specification is made so that TVCSR receives inputs from 3DIFA-1 for ARBSIGRQ1 and ARBSIGRQ4 and to output to 3DIFA-1 for ARBSIGGT1 and ARBSIGGT4. TVCSR has input/output terminals to the through silicon via, an input terminal from 3DARBA in FIG. 6, and a control input terminal for specifying whether TVCSR should output a signal or should be placed in a floating state (or output a weak signal). Coupled to the control input terminal is CTRLIO1 output from 3DARBA shown in FIG. 6. CTRLIO1 is asserted only when TVCSR is set for transmission and permission to use 3DIFA is granted, and remains asserted only in a period during which data is output. During the period in which CTRLIO1 remains asserted, the signal is output from TVCSR. Whether TVCSR receives a signal from the through silicon via or outputs a signal to the through silicon via is determined by the value of ARBMD in FIG. 6.

While 3DDRA-1 and 3DIFA-1 in LGLSI1 in FIG. 5 are shown in FIGS. 6 and 7, the other 3DDRA and 3DIFA in LGLSI1 and LGLSI2 also have the same configuration.

Figure 8:
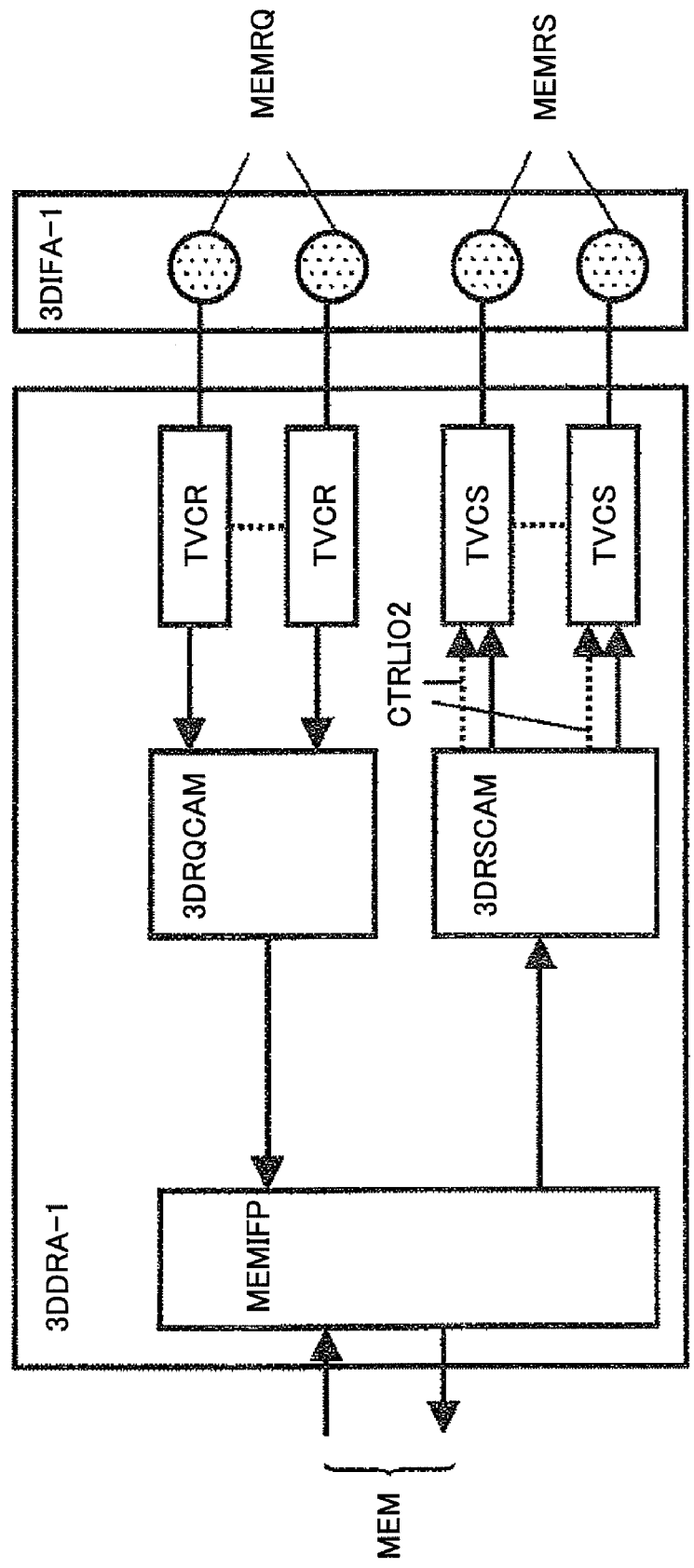
FIG. 8 is a diagram showing a through silicon via control section in a memory LSI.

FIG. 8 shows 3DDRA-1 and 3DIFA-1 in a memory LSI in FIG. 5. MEMIFP is an interface circuit to a memory block MEM. 3DRQCAM is a circuit which converts a read/write request from 3DIFA to a format for outputting to MEM and outputs the request to MEM. 3DRSCAM is a circuit which converts the format of data read from MEM and information associated with the data and outputs the data and information to TVCS. An input circuit TVCR is connected to MEMRQ to which a memory read/write request is coupled and an output circuit TVCS is connected to MEMRS that returns a reply from the memory. A control signal CTRLIO2 coupled to TVCS is asserted only in a period during which data is output to 3DIFA. During the assert period, TVCS continues outputting data. TVCS is in a floating state during the other period.

In the case where the directions of input and output are always fixed as in MEMRQ and MEMRS in FIG. 8, TVCS and TVCR can be used. On the other hand, if the same through silicon via is used to perform two-way communication, TVCSR is used because the directions of input and output change in a time-sharing manner. This is equivalent to a case where TVCS and TVCR connected to MEMRQ and MEMRS in FIG. 6 are changed to TVCSR and MEMRQ and MEMRS are used to perform communication from LGLSI1 to LGLSI2 or communication from LGLSI2 to LGLSI1. TVCSR is also used for a through silicon via that allows one-way communication and for a case where the directions of input and output are changed in the same circuit depending on LSIs as in the case of ARBSIGRQ and ARBSIGGT in FIG. 6.

Figure 9:
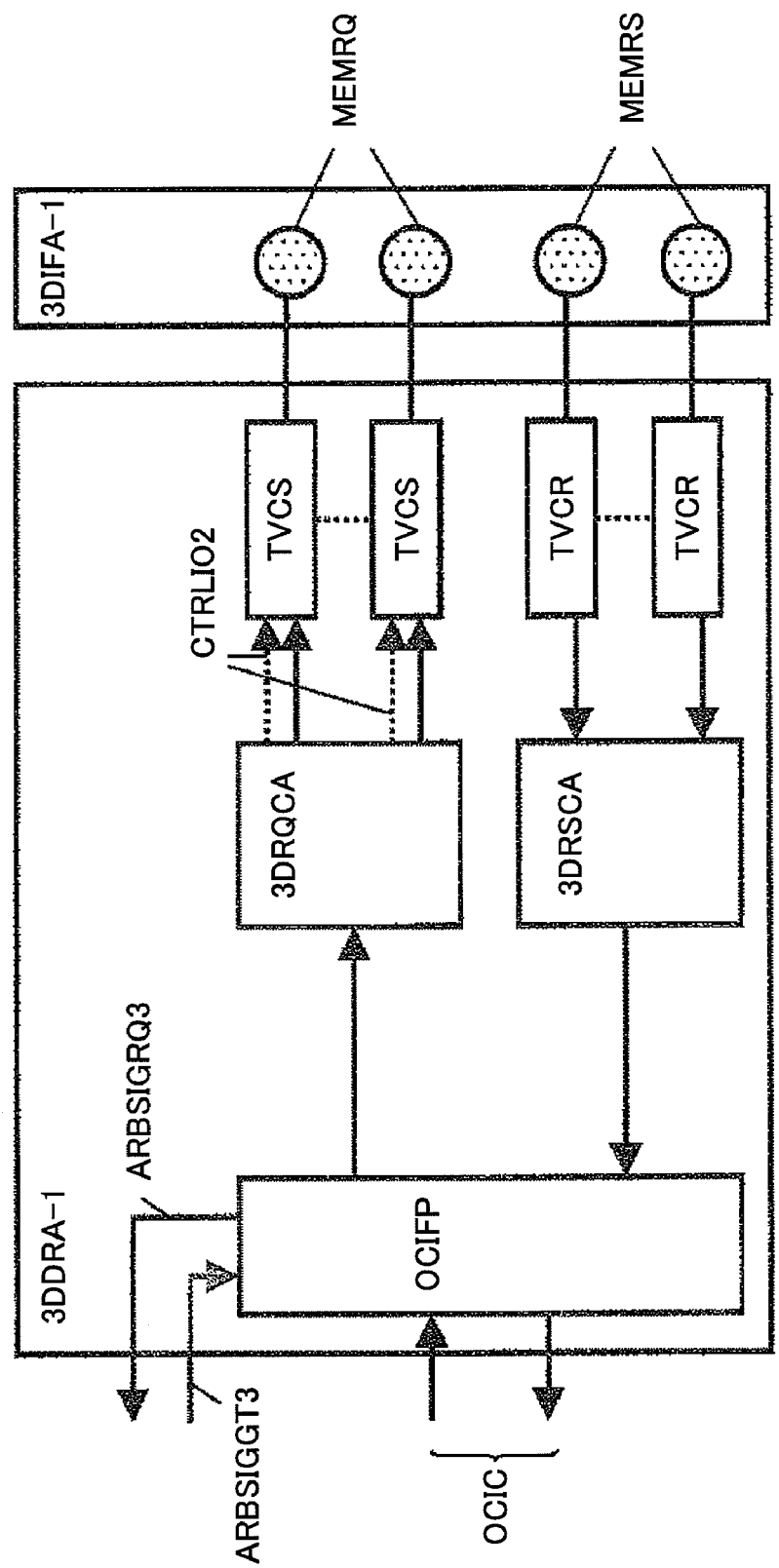
FIG. 9 is a diagram showing a through silicon via control section in an external-communication LSI.

FIG. 9 shows 3DDRA-1 and 3DIFA-1 in the external-communication LSI in FIG. 5. MEMRQ is a through silicon via used for sending a memory-access request. 3DDRA-1 of the external-communication LSI outputs, through ARBSIGRQ3, a request for permission to use MEMRQ to 3DDRA-1 of a logic LSI that arbitrates requests for permission to use MEMRQ in 3DIFA-1 and is granted permission to use MEMRQ through ARBSIGGT3. When the permission is granted, 3DDRA-1 of the external-communication LSI provides a memory-access request including information for synchronization between LSIs, LSI selection information for selecting one of the multiple stacked memory LSIs, command information indicating read/write, address information, a process identifier, and data to be written.

MEMRS is a through silicon via for the memory to return a reply such as read data. 3DDRA-1 of the external-communication LSI receives read data output from the memory, a process identifier, and a timing synchronization signal through MEMRS.

OCIFP in FIG. 9 is a circuit for interfacing with an on-chip interconnect OCIC. 3DRQCA is a circuit which converts a read/write request from OCIC to a format for outputting to MEMRQ and outputs the converted request to 3DARBA at a specified timing. 3DRSCA is a circuit which selects required data from data obtained through MEMRS, converts the format of the data, and outputs the converted data to OCIFP.

Figure 10:
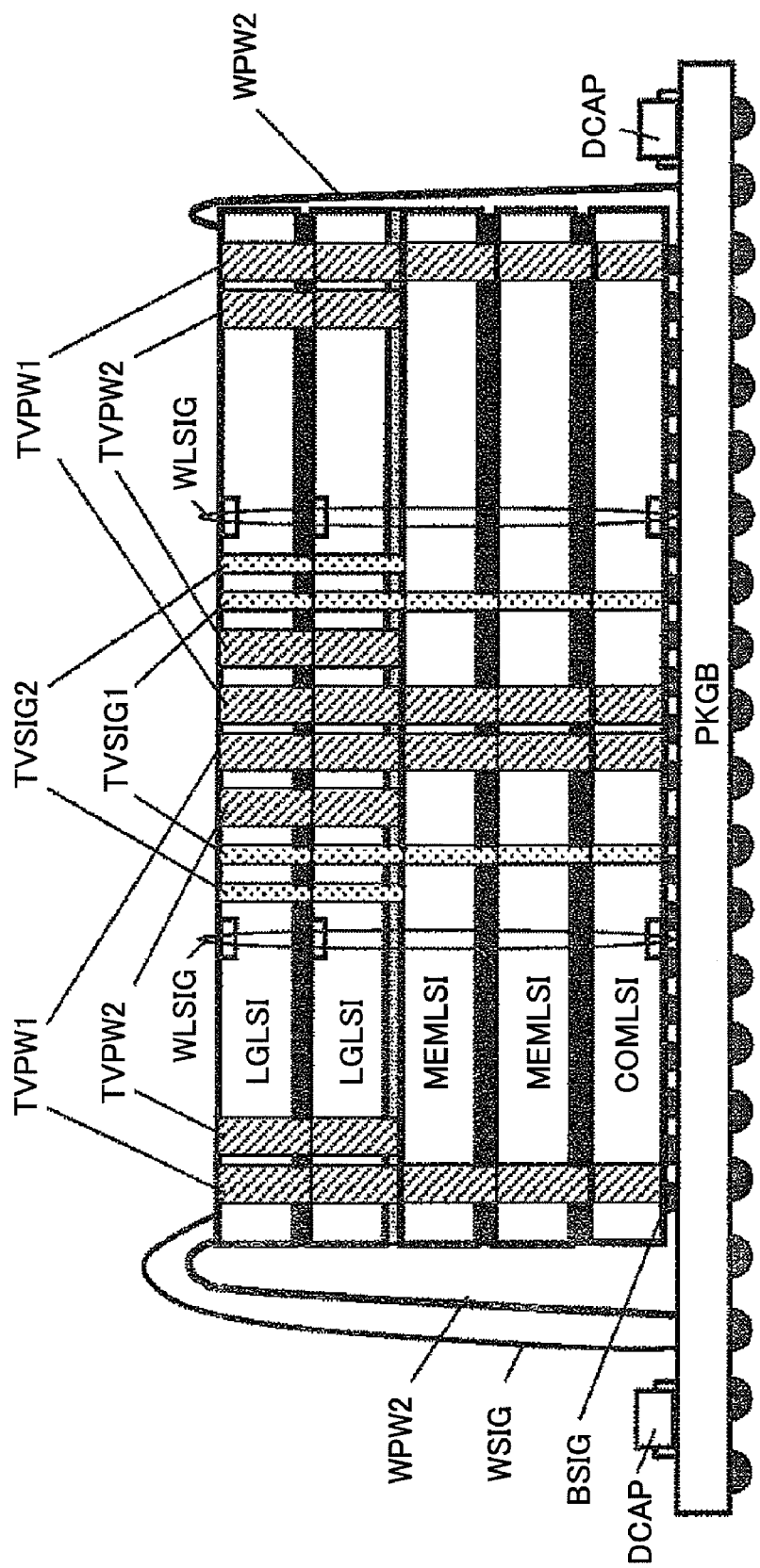
FIG. 10 is a diagram showing another configuration of a stacked memory LSI package.

FIG. 10 shows a configuration in which communication between a logic LSI and an external communication LSI, which is performed through a bonding wire WSIG in FIG. 1, is performed wirelessly. The wireless communication method used in this embodiment is magnetic inductive coupling. In this communication method, transmitting and receiving sides have coils and, an electric current is passed through the transmitting coil, and the receiving side detects a change in the magnetic field from the transmitting coil, thereby performing communication. The magnetic inductive coupling, which can be implemented by a simple configuration, is suitable for an LSI stack because the communication distances in the LSI stack are as small as several millimeters at a maximum. This configuration enables the wire bonding WSIG connection for communication between a logic LSI and the external communication LSI in FIG. 1 to be eliminated.

In the embodiment in FIG. 10, capacitances DCAP are provided on the package board (PKGB) in order to stabilize power-supply voltage. Power-supply design is important in the design phase of a system that uses the package. The integration of the capacitances DCAP can facilitate the design of the system.

Figure 11:
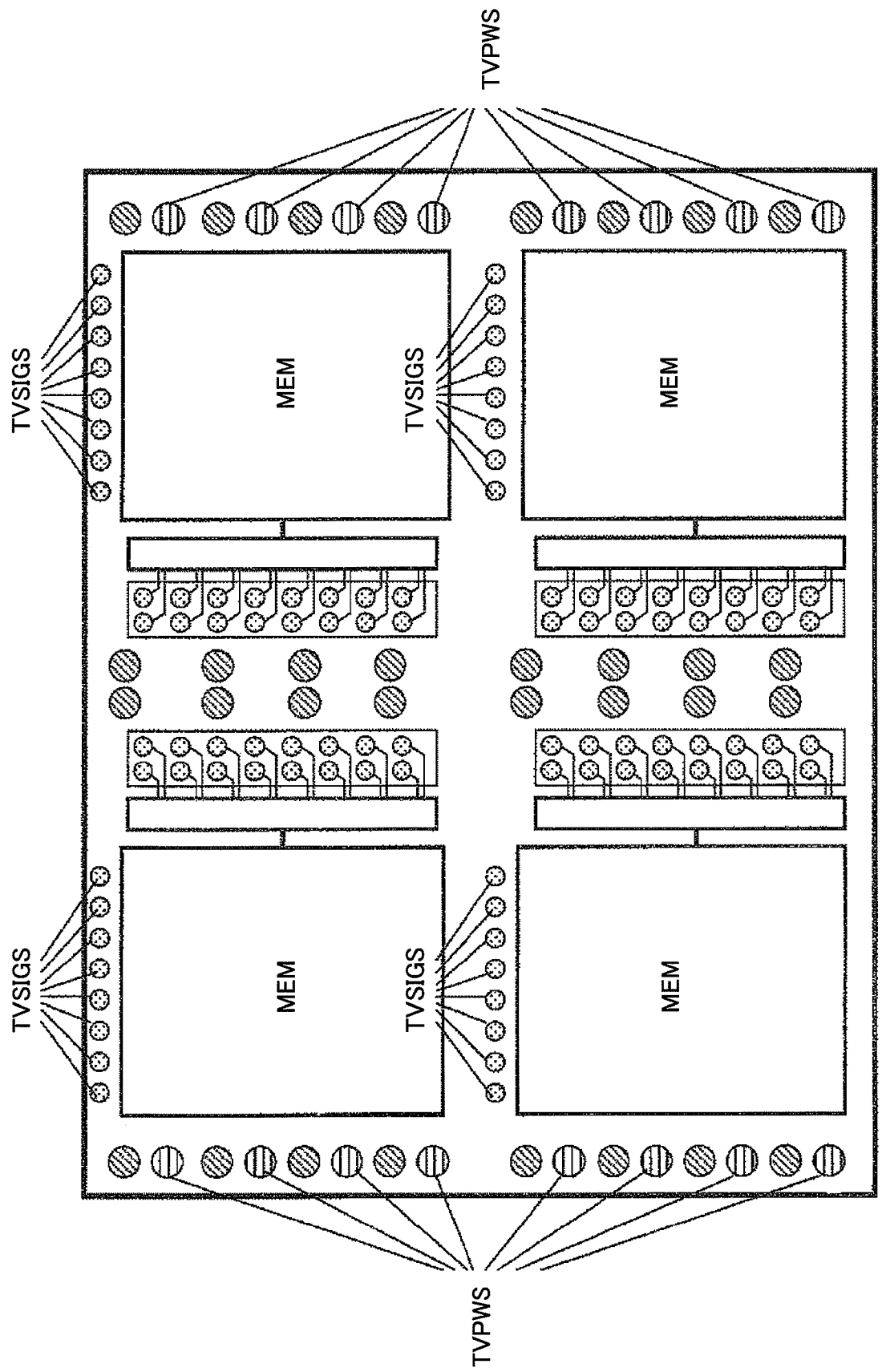
FIG. 11 is a diagram showing a configuration of another embodiment of a stacked memory LSI.

FIG. 11 shows a memory LSI designed to be stacked. Power-supply through silicon vias TVPWS which are not connected to a power-supply in the memory LSI and communication through silicon vias TVSIGS which do not affect the functionality of the memory LSI are added to the embodiment shown in FIG. 3. The power-supply through silicon vias TVPSW are used for supplying power to an LSI above or below the memory LSI and can replace the power-supply bonding wires in the configuration shown in FIG. 1. The through silicon vias TVSIGS are used for communication between the LSIs above and below the memory LSI and can replace the signal bonding wires in the configuration in FIG. 1. The provision of such generalized through silicon vias can further reduce the size of the memory LSI and improve the flexibility of stacked layers while ensuring general versatility of the memory LSI.

Figure 12:
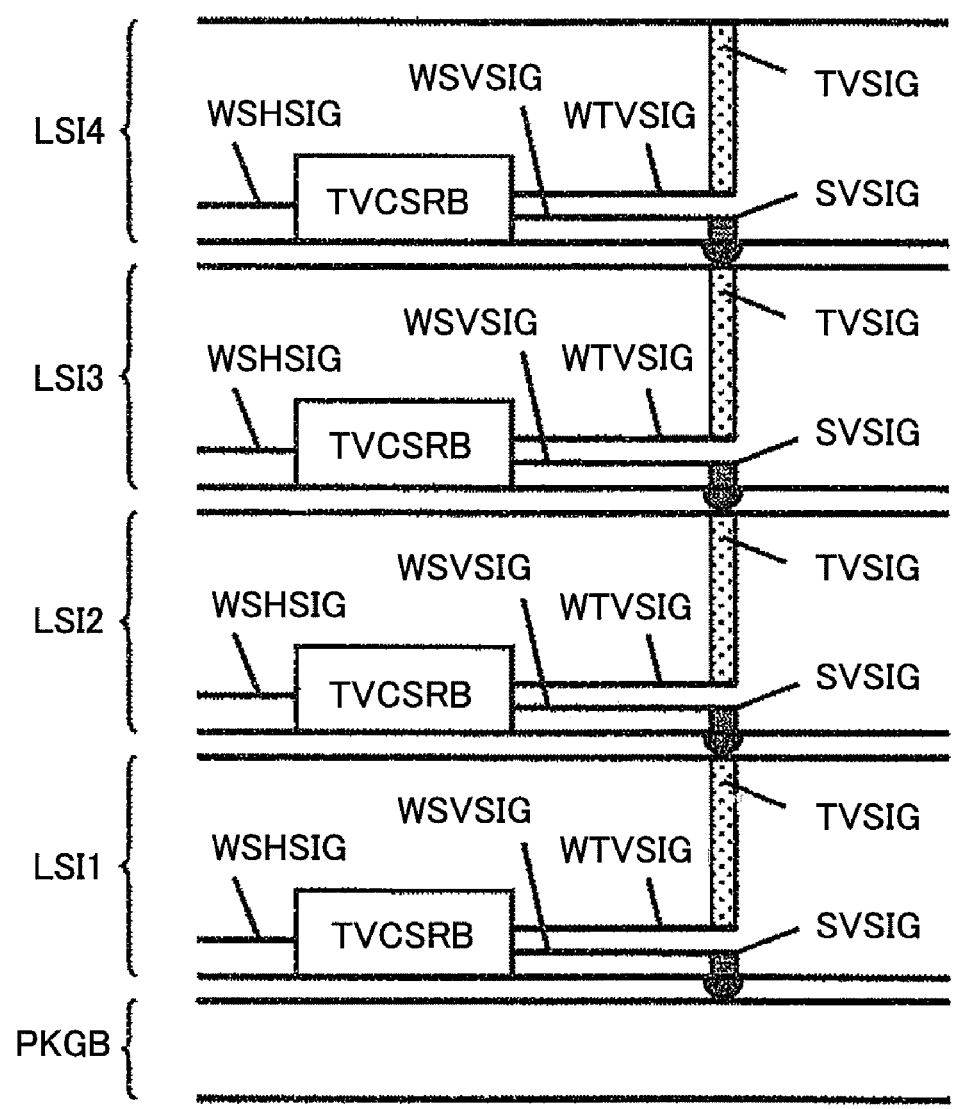
FIG. 12 is a diagram showing a cross-section of stacked LSIs.
Figure 13:
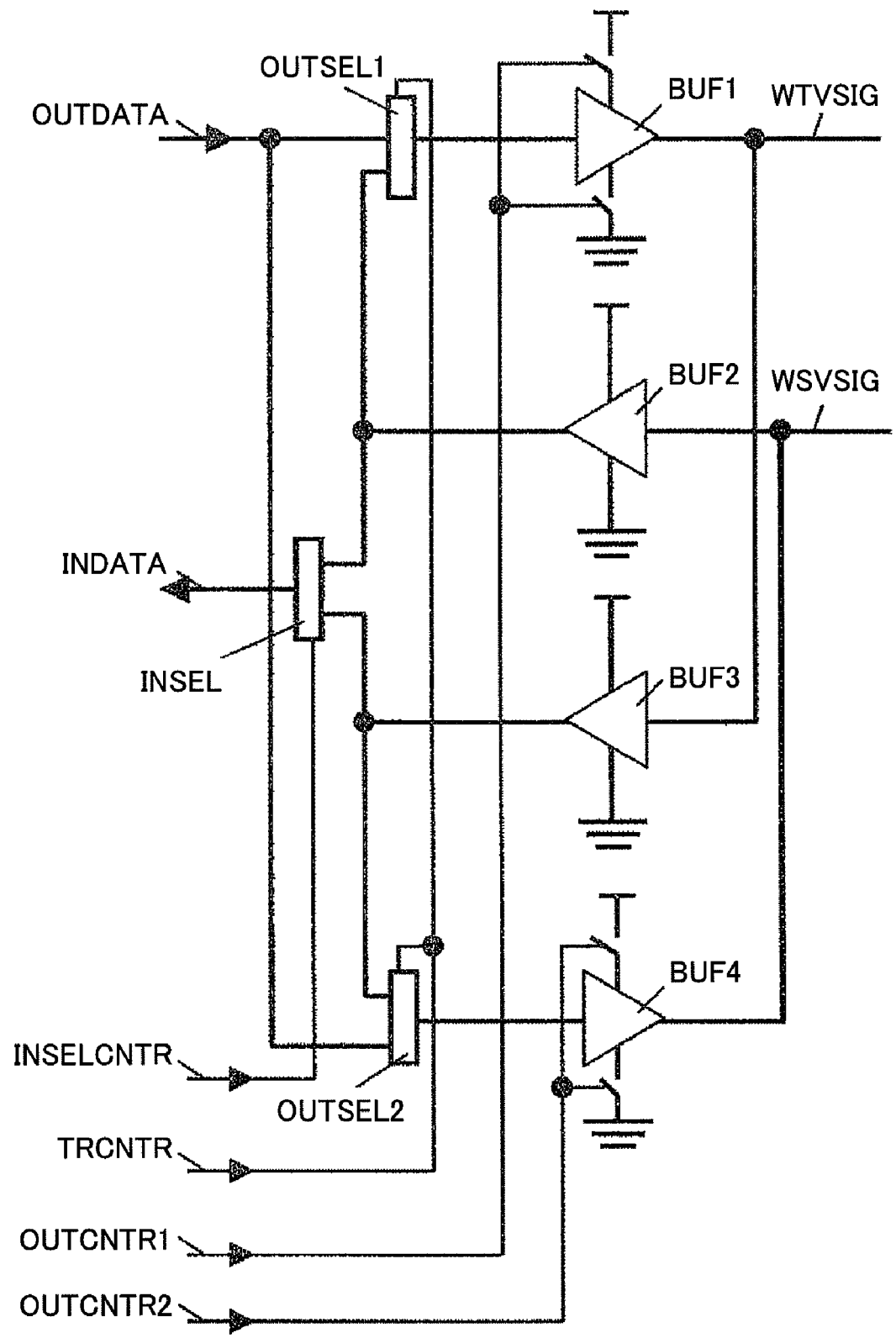
FIG. 13 is a diagram showing one embodiment of an input-output circuit.

FIGS. 12 and 13 show another configuration of the silicon-through-via driving circuit shown in FIG. 7. The configuration shown in FIG. 7 is useful for an LSI in which electrodes are formed from the bottom surface to the top surface of the LSI without placing a transistor between the bottom and top surfaces. The circuit shown in FIG. 13 has a configuration in which a transistor is inserted between electrodes in the bottom and top surfaces of an LSI.

FIG. 12 shows a cross section of LSIs stacked in a manner similar to that in FIG. 1. Only through silicon vias and surrounding portions are shown. In the example in FIG. 12, LSI1, LSI2, LSI3, and LSI4 are stacked on a package board PKGB and are interconnected by 3D interconnections with through silicon vias TVSIG. TVSIG is a through silicon via formed in the bottom surface of an LSI. SVSIG is a 3D electrode formed using an interconnection via and an interconnection layer by a conventional silicon process. TVCSRB is a circuit section connected to TVSIG and SVSIG. WTVSIG is a wiring line interconnecting TVSIG and TVCSRB. WSVSIG is a wiring line interconnecting SVSIG and TVCSRB. WSHSIG is a wiring line interconnecting TVCSRB and another circuit section. WTVSIG, WSVSIG, and WSHSIG are wiring lines formed by a conventional silicon process.

FIG. 13 shows one form of TVCSRB shown in FIG. 12. In FIG. 13, OUTSEL1, OUTSEL2, and INSEL are selector circuits for selecting and outputting one of two input signals. BUF1 and BUF4 are buffer circuits for transmitting a signal to a through silicon via and BUF2 and BUF3 are buffer circuits for receiving a signal from a through silicon via. OUTDATA is a signal input from another circuit section into TVCSRB and INDATA is a signal output to another circuit section. INSELCNTR and TRCNTR are control signals for controlling the selector circuits. OUTCNTR1 and OUTCNTR2 are control signals controlling on and off of the buffer circuits. OUTDATA, INDATA, INSELCTRL, OUTSELCNTR, OUTCNTR1, and OUTCNTR2 are signals coupled to other circuit sections and included in WSHSIG in FIG. 12.

The circuit shown in FIG. 13 differs from the circuit shown in FIG. 7 in that the circuit in FIG. 13 includes the functions of shaping and amplifying a signal passing through the LSI from the top surface to the bottom surface or vice versa. When a signal input from WTVSIG is to be transferred to WSVSIG, BUF1 is turned off (the switch of the buffer is shut off to place its output in a high-impedance state), BUF4 is turned on (the switch of the buffer is connected), and OUTSEL2 is controlled by the TRCNTR signal to cause the output of BUF3 to be provided to the input of BUF4. When a signal input from WSVSIG is to be transferred to WTVSIG, BUF1 is turned on, BUF4 is turned off, and OUTSEL1 is controlled by the TRCNTR signal to cause an output from BUF2 to be provided to the input of BUF1. When a signal from OUTDATA is to be output to WSVSIG, BUF4 is turned off, BUF1 is turned on, and OUTSEL1 is controlled by the TRCTR signal to cause the signal from OUTDATA to be provided to the input of BUF1. When a signal from OUTDATA is to be output to WSVSIG, BUF3 is turned on, BUF1 is turned off, and OUTSEL2 is controlled by the TRCTR signal to cause the signal from OUTDATA to be provided to the input of BUF signal. When a signal from WTVSIG is to be output from INDATA, INSEL is controlled by the INSELCNTR signal to cause an output from BUF3 to be input in INDATA. When a signal from WSVSIG is to be output from INDATA, INSEL is controlled by the INSELCNTR signal to cause an output from BUF2 to be input in INDATA. The insertion of TVCSRB between the electrode (TVSIG) in the bottom surface of the LSI and the electrode (SVSIG) in the top surface of the LSI in this way enables fast communication even if many LSI are stacked and through silicon vias are elongated.

What is claimed is:

1. A semiconductor device having a plurality of LSIs stacked in a semiconductor package, comprising:
    a package board;
    a first LSI connected to the package board and comprising a communication circuit performing data communication with the outside of the semiconductor package;
    a second LSI disposed above the first LSI and including a first storage device which has a plurality of first memory cells provided at intersection points of a plurality of first bit lines and a plurality of first word lines;
    a third LSI disposed above the second LSI and performing arithmetic processing by using information stored in the first storage device; and
    a first through silicon via penetrating the second LSI and electrically interconnecting the first, second, and third LSIs.

2. The semiconductor device according to claim 1, wherein the first LSI writes first data received from a source outside the semiconductor package into the second LSI; and
    the third LSI reads the first data from the second LSI and performs the arithmetic processing on the first data.

3. The semiconductor device according to claim 1, wherein:
    the third LSI writes second data resulting from the arithmetic processing into the second LSI; and
    the first LSI reads the second data from the second LSI and sends the second data to the outside of the semiconductor package.

4. The semiconductor device according to claim 1, wherein the first through silicon via penetrates the first, second, and third LSIs.

5. The semiconductor device according to claim 1, wherein the third LSI comprises a circuit performing the arithmetic processing disposed on the lower surface of the third LSI.

6. The semiconductor device according to claim 1, wherein
the first through silicon via penetrates the first and second LSIs; and
the first LSI includes the communication circuit disposed on the lower surface of the first LSI.

7. The semiconductor device according to claim 1, further comprising a first bonding wire interconnecting the package board and the third LSI, wherein:
first electric power is supplied to the first, second, and third LSIs through the first through silicon via; and
second electric power having a voltage different from the voltage of the first electric power is supplied to the third LSI through the first bonding wire.

8. The semiconductor device according to claim 7, further comprising:
a fourth LSI disposed between the second and third LSIs performing arithmetic processing using information stored in the first storage device; and
a second through silicon via penetrating the fourth LSI and electrically interconnecting the third and fourth LSIs, but not the first and second LSIs; wherein
the first electric power is supplied to the first, second, third, and fourth LSIs through the first through silicon via; and
the second electric power having a voltage higher than the voltage of the first electric power is supplied to the third and fourth LSIs through the second through silicon via.

9. The semiconductor device according to claim 1, further comprising:
a fourth LSI disposed between the second and third LSIs and performing arithmetic processing by using information stored in the first storage device; and
a second through silicon via penetrating the fourth LSI and electrically interconnecting the third and fourth LSIs, but not the first and second LSIs; wherein
data communication among the first, second, third, and fourth LSIs is performed through the first through silicon via; and
data communication between the third and fourth LSIs is performed through the second through silicon via.

10. The semiconductor device according to claim 1, further comprising a second bonding wire electrically interconnecting the package board and the third LSI; wherein
third data is communicated among the first, second, and third LSIs through the first through silicon via; and
fourth data is communicated between the first and third LSIs through the second bonding wire.

11. The semiconductor device according to claim 10, wherein the fourth data is identification information of the third LSI or information indicating an initial value of an operating frequency of the third LSI.

12. The semiconductor device according to claim 1, wherein
the first LSI further includes a first circuit block which, in an active state, outputs input data to the first through silicon via and, in an inactive state, places an output to the first through silicon via in a state independent of input data, and a first control block for controlling the first circuit block;
the third LSI further includes a second circuit block which, in an active state, outputs input data to the first through silicon via and, in an inactive state, places an output to the first through silicon via in a state independent of input data, and a second control block for controlling the second circuit block;
one of the first and second control blocks includes an arbitration function for determining which of the first and third LSIs should be granted access to the second LSI;
if the first control block includes the arbitration function and grants the first LSI access to the second LSI, the first control block places the first circuit block in the active state;
if the first control block includes the arbitration function and grants the third LSI access to the second LSI, the first control block places the first circuit block in the inactive state and sends a first signal indicating permission to use the first through silicon via to the second control block; and
if the first control block does not includes the arbitration function, the first control block places the first circuit block in the active state when the first control block receives a second signal indicating permission to use the first through silicon via from the second control block, and places the first circuit block in the inactive state when the first control block does not receive the second signal from the second control block.

13. The semiconductor device according to claim 12, wherein
if the first LSI accesses the second LSI more frequently than the third LSI accesses the second LSI, the first control block includes the arbitration function; and
if the third LSI accesses the second LSI more frequently than the first LSI accesses the second LSI, the second control block includes the arbitration function.

14. The semiconductor device according to claim 12, wherein the first and second control blocks receive a specification signal indicating which of the first and second control blocks includes the arbitration function.

15. The semiconductor device according to claim 14, wherein:
the first LSI includes a first terminal for receiving the specification signal from a source outside the first LSI; and
the third LSI includes a second terminal for receiving the specification signal from a source outside the third LSI.

16. The semiconductor device according to claim 12, further comprising a nonvolatile memory storing an indication of which of the first and second control blocks includes the arbitration function.

17. The semiconductor device according to claim 1, further comprising:
a fifth LSI disposed between the first and second LSIs and comprising a second storage device including a plurality of memory cells provided at intersection points of a plurality of second bit lines and a plurality of second word lines; and
a sixth LSI disposed between the second and third LSIs and performing arithmetic processing by using information stored in the first or second storage device; wherein
the second LSI receives a first identification signal for distinguishing the second LSI from the fifth LSI;
the fifth LSI receives a second identification signal for distinguishing the fifth LSI from the second LSI;
the third LSI receives a third identification signal for distinguishing the third LSI from the fifth LSI; and
the sixth LSI receives a fourth identification signal for distinguishing the sixth LSI from the third LSI.

18. The semiconductor device according to claim 17, wherein
the second LSI includes a first terminal receiving the first identification signal from a source outside the second LSI;
the fifth LSI includes a second terminal receiving the second identification signal from a source outside the fifth LSI;
the third LSI includes a third terminal receiving the third identification signal from a source outside the third LSI; and
the sixth LSI includes a fourth terminal receiving the fourth identification signal from a source outside the sixth LSI.

19. The semiconductor device according to claim 17 further comprising a nonvolatile memory storing the first to fourth identification signals.

20. The semiconductor device according to claim 1, wherein
fifth data is communicated among the first, second, and third LSIs through the first through silicon via; and
the fifth data includes first information indicating an LSI sending the fifth data and second information indicating an LSI to which the fifth data is to be sent.

21. The semiconductor device according to claim 1, wherein
the first LSI further includes a first wireless communication circuit;
the third LSI further includes a second wireless communication circuit; and
the first and second wireless communication circuits are used to perform data communication between the first LSI and the third LSI.

22. The semiconductor device according to claim 1, further comprising a third through silicon via which is connected to a power-supply terminal of each of the first and third LSI, penetrates the second LSI, and is not connected to a power-supply terminal of the second LSI, wherein
the first through silicon via supplies first electric power to the first, second, and third LSIs; and
the third through silicon via supplies third electric power having a voltage different from the voltage of the first electric power to the third LSI.

23. The semiconductor device according to claim 1, further comprising a fourth through silicon via which electrically interconnects the first and third LSIs, penetrates the second LSI, and is not connected to an input terminal of the first storage device, wherein
communication between the first and third LSIs is performed through the fourth through silicon via.

24. The semiconductor device according to claim 1, wherein the first through silicon via comprises: a first circuit disposed between the upper and lower surfaces of the first LSI for amplifying a signal in communication between the upper and lower surfaces of the first LSI, a second circuit disposed between the upper and lower surfaces of the second LSI for amplifying a signal in communication between the upper and lower surfaces of the second LSI, and a third circuit disposed between the upper and lower surfaces of the third LSI for amplifying a signal in communication between the upper and lower surfaces of the third LSI.

* * * * *